United States Patent
Chen et al.

(10) Patent No.: US 6,885,080 B2
(45) Date of Patent: Apr. 26, 2005

(54) DEEP TRENCH ISOLATION OF EMBEDDED DRAM FOR IMPROVED LATCH-UP IMMUNITY

(75) Inventors: Tze-Chiang Chen, Yorktown Heights, NY (US); Liang-Kai Han, Fishkill, NY (US)

(73) Assignee: International Business Machines Corporation, Armonk, NY (US)

( * ) Notice: Subject to any disclaimer, the term of this patent is extended or adjusted under 35 U.S.C. 154(b) by 295 days.

(21) Appl. No.: 10/082,648

(22) Filed: Feb. 22, 2002

(65) Prior Publication Data
US 2003/0162400 A1 Aug. 28, 2003

(51) Int. Cl.[7] .............................................. H01L 29/00
(52) U.S. Cl. ...................................... 257/510; 257/513
(58) Field of Search ................................ 257/371, 506, 257/510, 513; 438/424–433

(56) References Cited
U.S. PATENT DOCUMENTS

| | | | |
|---|---|---|---|
| 4,947,227 A | 8/1990 | Teng .............................. 357/42 |
| 5,474,953 A | * 12/1995 | Shimizu et al. ............. 438/426 |
| 5,627,092 A | 5/1997 | Alsmeier et al. ............ 438/152 |
| 5,770,504 A | 6/1998 | Brown et al. ................ 438/296 |
| 5,945,704 A | 8/1999 | Schrems et al. ............. 257/301 |
| 6,017,785 A | 1/2000 | Han et al. .................... 428/199 |
| 6,033,949 A | 3/2000 | Baker et al. ................. 438/232 |
| 6,069,037 A | 5/2000 | Liao ............................ 438/241 |
| 6,110,797 A | 8/2000 | Perry et al. .................. 438/424 |
| 6,137,152 A | * 10/2000 | Wu .............................. 257/510 |
| 6,214,696 B1 | 4/2001 | Wu .............................. 438/424 |
| 6,228,726 B1 | 5/2001 | Liaw .......................... 438/294 |
| 6,297,127 B1 | 10/2001 | Chen et al. ................. 438/424 |
| 6,335,556 B1 | * 1/2002 | Kitazawa et al. ........... 257/510 |
| 6,350,653 B1 | * 2/2002 | Adkisson et al. ........... 438/258 |
| 6,486,525 B1 | * 11/2002 | Aton ........................... 257/510 |

* cited by examiner

*Primary Examiner*—Duy-Vu N. Deo
(74) *Attorney, Agent, or Firm*—Ira D. Blecker; Cantor Colburn LLP

(57) ABSTRACT

A protective structure for blocking the propagation of defects generated in a semiconductor device is disclosed. In an exemplary embodiment, the structure includes a deep trench isolation formed between a memory storage region of the semiconductor device and a logic circuit region of the semiconductor device, the deep trench isolation being filled with an insulative material. The deep trench isolation thereby prevents the propagation of crystal defects generated in the logic circuit region from propagating into the memory storage region.

11 Claims, 3 Drawing Sheets

DEEP TRENCH ISOLATION OF EMBEDDED DRAM FOR IMPROVED LATCH-UP IMMUNITY

BACKGROUND

The present disclosure relates generally to semiconductor device manufacturing and, more particularly, to deep trench isolation of embedded DRAM (eDRAM) to improve latch-up immunity.

In the integrated circuit (IC) industry, manufacturers are embedding dynamic random access memory (DRAM) arrays on the same substrate as microprocessor cores or other logic devices. This technology is commonly referred to as embedded DRAM (eDRAM). Embedded DRAM provides microcontrollers and other logic devices with faster access to larger capacities of on-chip memory at a lower cost than other currently available systems having conventional embedded static random access memory (SRAM) and/or electrically erasable programmable read only memory (EEPROM).

The structural requirements and process steps used in forming logic devices (e.g., flip-flops, inverters, etc.) are generally not compatible with the structural requirements and processing steps of a DRAM cell. For example, logic devices generally benefit from having higher doped source and drain regions, whereas DRAM cells generally benefit from lighter doped source and drain regions. Moreover, as integrated semiconductor devices continue to grow in complexity, there is a constant need to increase the density of the devices. This increase in density can create several problems, particularly with eDRAM devices, that can lead to device failure if not addressed. One such problem stems from the propensity for some semiconductor devices, such as those included in CMOS circuitry, to "latch-up." Latch-up is a well known problem triggered by certain electrical conditions acting upon unwanted parasitic bipolar transistors contained in the device structure.

More specifically, latch-up is typically caused by the close proximity of n-channel and p-channel elements in modern CMOS devices. For example, a typical CMOS device fabricated on a p-type substrate would contain a p-channel element fabricated in a n-well (or n-type region) and an n-channel element fabricated in a p-well (or p-type region), with only a short distance between the wells. This structure inherently forms a parasitic lateral bipolar structure (npn) and parasitic vertical bipolar structure (pnp). Under certain biasing conditions, the pnp structure can supply base current to npn structure (or vice versa), thereby causing a large current to flow from one well to the other well. This large current creates excessive heat which can subsequently damage the CMOS device.

The propensity for CMOS devices to latch-up has been addressed in several ways. One conventional method for suppressing latch-up involves the implantation of heavily doped regions (e.g., with boron ions in the p-well, or phosphorous ions in the n-well) at high implantation energies. The introduction of the higher concentration dopants serves to reduce the substrate/well resistance, thereby decreasing the tendency for a parasitic vertical transistor to turn on. However, as a result of these high dose/high energy implants, crystal defects may be generated in the implantation (CMOS) area and propagated relatively long distances, possibly even into a neighboring array of embedded DRAM storage cells. The propagated defects, in turn, can increase the junction leakage of the less tolerant DRAM cells and thereby negatively impact the data retention time of those cells. Accordingly, it is desirable (especially in view of continued device miniaturization) to continue to improve CMOS latch-up immunity without degrading DRAM retention time.

BRIEF SUMMARY

The above discussed and other drawbacks and deficiencies of the prior art are overcome or alleviated by a protective structure for blocking the propagation of defects generated in a semiconductor device. In an exemplary embodiment, the structure includes a deep trench isolation formed between a memory storage region of the semiconductor device and a logic circuit region of the semiconductor device, the deep trench isolation being filled with an insulative material. The deep trench isolation thereby prevents the propagation of crystal defects generated in the logic circuit region from propagating into the memory storage region.

In a preferred embodiment, the deep trench isolation is formed beneath a shallow trench isolation, the shallow trench isolation for electrically isolating devices contained in the memory storage region from devices contained in the logic circuit region. Preferably, a plurality of deep trench isolations surrounds the memory storage region. The plurality of deep trench isolations further include an inner perimeter and an outer perimeter, wherein individual deep trench isolations included in the outer perimeter are disposed adjacent to gaps in between individual deep trench isolations included in the inner perimeter. In one embodiment, the memory storage region is a DRAM array region including a plurality of deep trench storage capacitors. The logic circuit region further includes a plurality of CMOS devices, and a high dose impurity layer implanted within a substrate of the logic circuit region. The high dose impurity layer is used to inhibit parasitic bipolar transistor action between the plurality of CMOS devices.

BRIEF DESCRIPTION OF THE DRAWINGS

Referring to the exemplary drawings wherein like elements are numbered alike in the several Figures.

DETAILED DESCRIPTION

Figure 1:
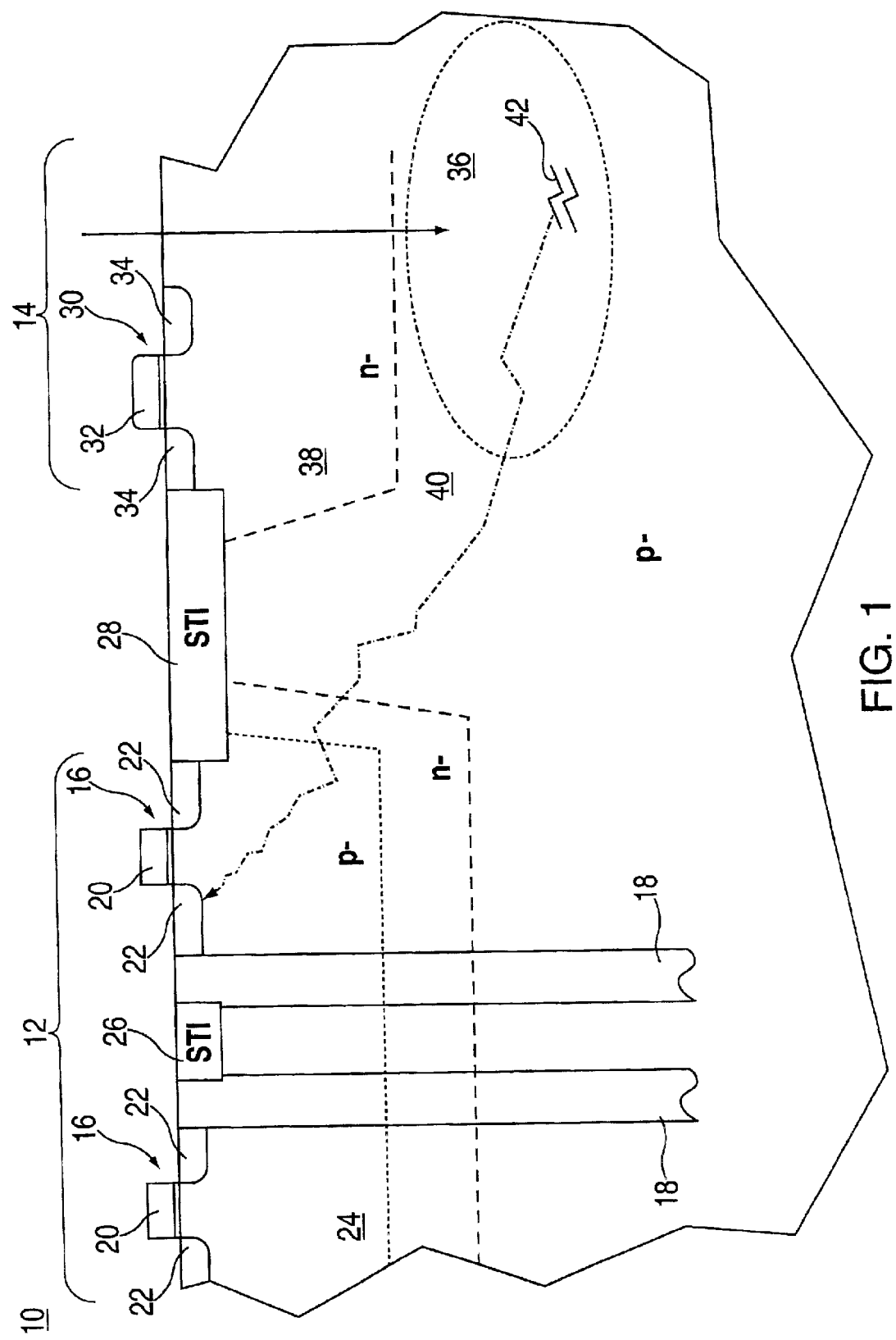
FIG. 1 is a side cross sectional view of an existing embedded DRAM (eDRAM) device, particularly illustrating the interface between a DRAM array region and a logic circuit region.

Referring initially to FIG. 1, there is shown a cross sectional view of an existing embedded DRAM (eDRAM) device 10. The eDRAM device 10 includes a DRAM array region 12 (in which an array of individual DRAM storage cells are configured), as well as a logic circuit region 14 in which various logic circuitry is located. Generally speaking, the DRAM array region 12 includes a number of individual DRAM storage cells each having an access transistor 16 and a trench storage capacitor 18. The access transistors 16 further include a gate 20, as well as source/drain diffusion areas 22. In the example illustrated, diffusion areas 22 are n-type diffusions formed within in a lightly doped p-well 24. However, it should be understood that the diffusions may also be p-type formed within an n-well. When activated through a corresponding wordline (not shown), a given gate 20 of an access transistor 16 couples the corresponding trench capacitor 18 to a bitline (not shown) connected to one of the source/drain diffusion area 22. Thereby, a voltage representing a binary bit of information may be stored into or read from capacitor 18. A further, more detailed explanation on the operation of a DRAM device is not presented hereinafter, as the specific operation thereof is well known in the art.

FIG. 1 also illustrates a shallow trench isolation (STI) 26 used to provide intra-cell isolation between DRAM cells within the DRAM array region 12. The formation of shallow trench isolation areas is well known in the art and is generally accomplished by forming a trench within a semiconductor surface and thereafter filling the trench with an insulative material, such as an oxide material. Likewise, an STI 28 is also used to isolate devices within the DRAM array region 12 from devices within the logic circuit region 14. The logic circuit region 14 may also include transistors 30 having gates 32 and source/drain diffusion areas 34, although the doping profiles and cell structures thereof are likely different than those of the DRAM access transistors 16.

Furthermore, the logic circuit region 14 (containing tight ground rule CMOS circuitry) may have high dose impurity layers implanted therein to address the latch-up problem discussed previously. Such a high dose impurity layer 36 is shown in the logic circuit region 14 of FIG. 1. The high dose impurity layer 36 (e.g., p-type boron or n-type phospohrous ions) is implanted at a depth and an energy level sufficient to reduce substrate/well resistance and inhibit parasitic bipolar transistor action. In the example illustrated, impurity layer is shown implanted below a lightly doped n-well 38 and within a lightly doped p-type region 40.

The high energy implantation process results in crystal deformities or defects of the substrate in areas local to the impurity layer 36. As a result, the defect(s) 42 may be propagated a distance through the device substrate and into undesired areas. With the present configuration between the DRAM array region 12 and the logic circuit region 14 (i.e., the regions being separated only by STI 28), there exists the possibility that the crystal defect(s) caused by high dose, high energy implantation may be propagated through the CMOS logic circuit region 14 and into the DRAM array region 12. This, in turn, could cause excess junction leakage in the access transistors 16 of the DRAM cells, thereby resulting in charge retention problems within the storage capacitors 18. Thus, it is desirable to address the problem of preventing excess junction leakage while still providing good latch-up immunity for the CMOS circuitry.

Figure 2:
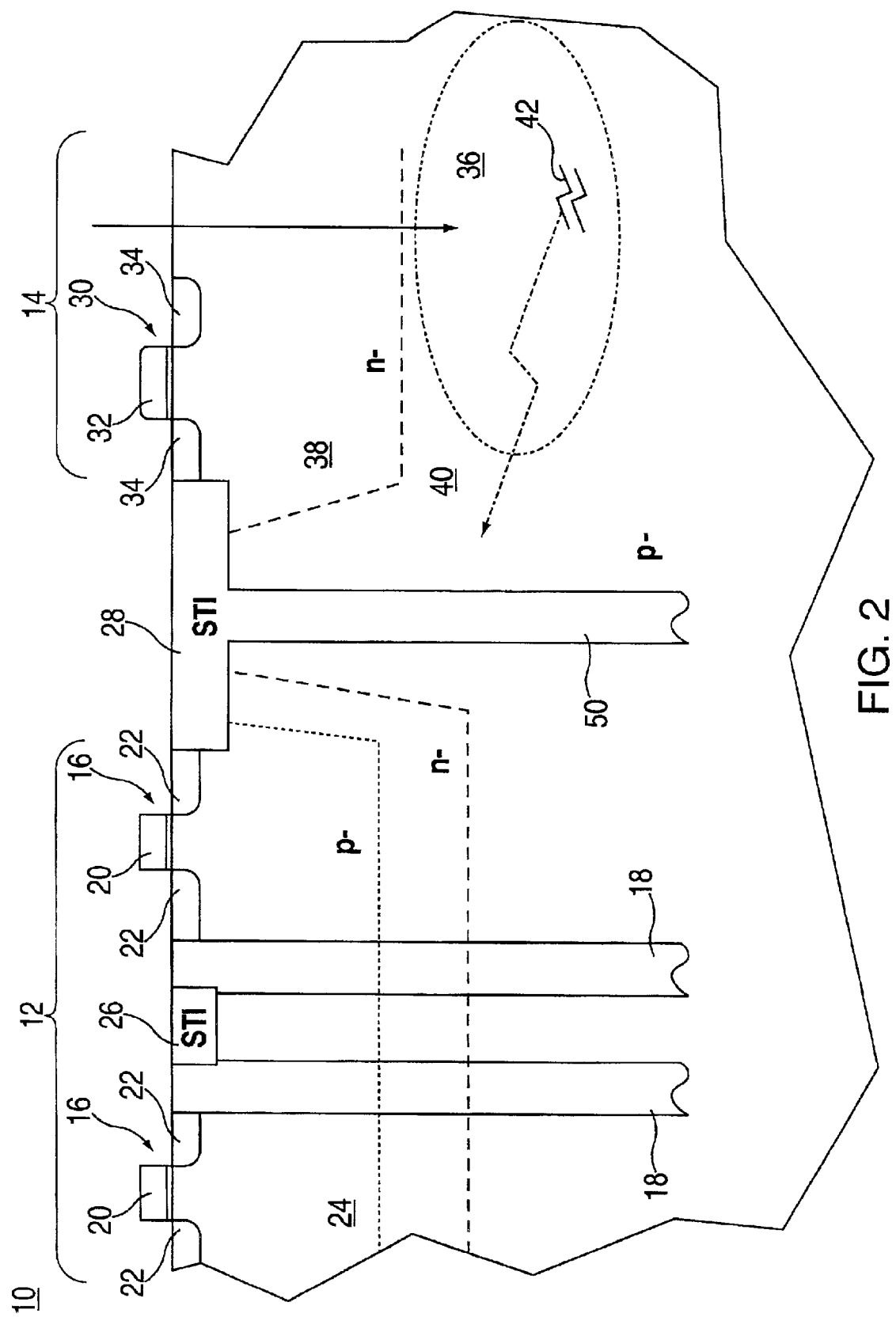
FIG. 2 is a side cross sectional view of an eDRAM device featuring a deep trench isolation between a DRAM array region and a logic circuit region.

Therefore, in accordance with an embodiment of the invention, there is disclosed a method and structure for providing a deep trench isolation region between an interface of a DRAM array region and a logic region within an eDRAM device. Referring now to FIG. 2, the eDRAM device 10 of FIG. 1 is modified to include a deep trench isolation 50 between the DRAM array region 12 and the logic circuitry region 14. For ease of description, consistent reference numerals are used to describe like elements between FIGS. 1 and 2.

As opposed to being used for charge storage, the deep trench isolation 50 is filled with an insulative material to block any crystal defects formed within the logic circuitry region 14 from being propagated into the DRAM array region 12. Moreover, the deep trench isolation 50 may be formed using the same techniques as are implemented in the formation of trench capacitors (e.g., patterning, masking, etching and filling), thereby resulting in a process efficient solution to the latch-up problem.

Figure 3:
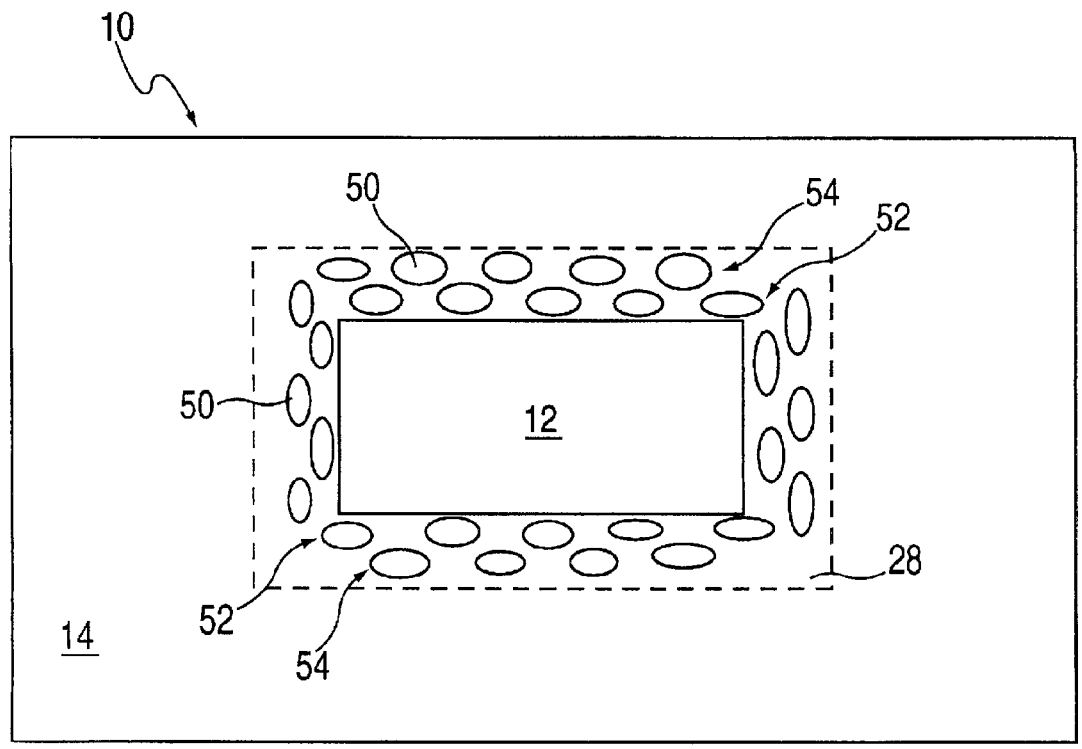
FIG. 3 is a top cross sectional view of one possible layout configuration for deep trench isolations surrounding a DRAM array region.

In order to adequately protect the DRAM array region 12 from intrusion by a propagated defect from the logic circuitry region, a plurality of deep trench isolations 50 are employed in a perimeter configuration, as illustrated in FIG. 3. As can be seen from the top view of FIG. 3, an inner perimeter 52 of deep trench isolations 50 surrounds DRAM array region 12. In addition, an outer perimeter 54 of deep trench isolations 50 surrounds the inner perimeter 52 so as to bridge the interstitial gaps between individual deep trench isolations 50 within the inner perimeter 52. Both the inner perimeter 52 and the outer perimeter 54 are formed underneath shallow trench isolation 28, which completely surrounds the DRAM array region 12.

Figure 4A:
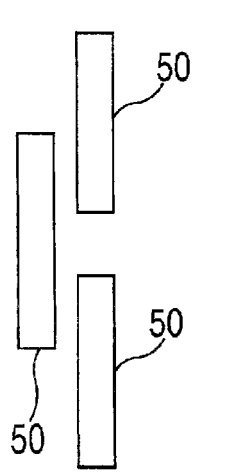
FIGS. 4(a) through 4(d) illustrate various possible patterns for isolation deep trenches illustrated in FIGS. 2 and 3.
Figure 4B:
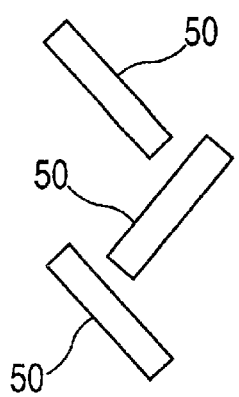

In the exemplary embodiment of FIG. 3, the individual deep trench isolations 50 have a generally elliptical cross-sectional configuration. However, other trench shapes may be also implemented, as well as different pattern configurations with respect to the inner and outer perimeters 52, 54. For example, FIG. 4(a) illustrates an overlapping trench configuration wherein the individual trench isolations 50 are generally rectangular in cross section. In FIG. 4(b), the trench isolations 50 are generally rectangular in cross section but are skewed with respect to one another. However, it will still be noted that the arrangement of trench isolations of FIG. 4(b) are intended to prevent any gaps through which a propagated defect 42 in the logic circuitry region 14 may pass.

Figure 4C:
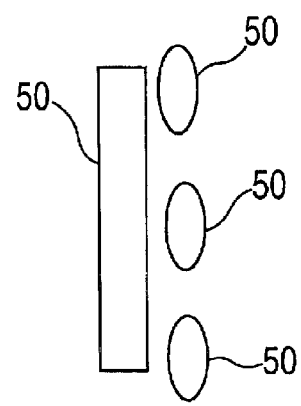
Figure 4D:
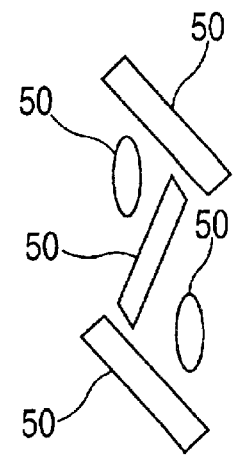

FIG. 4(c) further illustrates an embodiment in which a hybrid combination of trench isolation patterns may be used. In this example, a first of the perimeters includes a spacing of elliptically shaped trench isolations 50, while the other perimeter includes one or more rectangular shaped trench isolations 50 to bridge the gaps in the first perimeter. Finally, FIG. 4(d) illustrates still another possible trench isolation pattern, using a combination of rectangular and elliptical trench isolations 50 disposed in a skewed fashion with respect to one another.

It should be noted that the exemplary patterns illustrated in FIGS. 4(a)–(d) are by no means an exhaustive set of contemplated arrangements, as the present invention embodiments contemplate any arrangement and placement of deep trench isolations 50 that provide a protective perimeter against any defect that could be propagated underneath a shallow trench isolation and into the DRAM storage capacitors of the DRAM array region of an embedded DRAM device.

While the invention has been described with reference to a preferred embodiment, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A protective structure for blocking the propagation of defects generated in a semiconductor device, the structure comprising:

a plurality of deep trench isolations formed between a memory storage region of the semiconductor device and a logic circuit region of the semiconductor device, said plurality of deep trench isolations being filled with an insulative material;

said plurality of deep trench isolations further comprising an inner perimeter and an outer perimeter, wherein individual deep trench isolations included in said outer perimeter are disposed adjacent to gaps in between individual deep trench isolations included in said inner perimeter; and wherein said plurality of deep trench isolations prevent the propagation of crystal defects generated in said logic circuit region from propagating into said memory storage region.

2. The structure of claim 1, wherein each of said plurality of deep trench isolations are formed beneath a corresponding shallow trench isolation, said shallow trench isolation for electrically isolating devices contained in said memory storage region from devices contained in said logic circuit region.

3. The structure of claim 1, wherein said plurality of deep trench isolations surround said memory storage region.

4. The structure of claim 1, wherein said memory storage region comprises a DRAM array region.

5. The structure of claim 1, wherein said memory storage region comprises a DRAM array region.

6. The structure of claim 5, wherein said logic circuit region further includes:

a plurality of CMOS devices; and a high dose impurity layer implanted within a substrate of said logic circuit region, said high dose impurity layer used to inhibit parasitic bipolar transistor action between said plurality of CMOS devices.

7. An embedded DRAM (eDRAM) device, comprising:

a logic circuit region;

a memory storage region embedded adjacent said logic circuit region;

a shallow trench isolation for electrically insulating devices included within said memory storage region from devices included within said logic circuit region;

a plurality of deep trench isolations, formed underneath said shallow trench isolation, said plurality of deep trench isolations for preventing the propagation of crystal defects generated in said logic circuit region from propagating into said memory storage region; and said plurality of deep trench isolations further comprising an inner perimeter and an outer perimeter, wherein individual deep trench isolations included in said outer perimeter are disposed adjacent to gaps in between individual deep trench isolations included in said inner perimeter.

8. The eDRAM device of claim 7, wherein said shallow trench isolation surrounds said memory storage region.

9. The eDRAM device of claim 8, wherein said plurality of deep trench isolations surround said memory storage region.

10. The eDRAM device of claim 8, wherein said memory storage region includes a plurality of deep trench storage capacitors.

11. The eDRAM device of claim 10, wherein said logic circuit region further includes:

a plurality of CMOS devices; and a high dose impurity layer implanted within a substrate of said logic circuit region, said high dose impurity layer used to inhibit parasitic bipolar transistor action between said plurality of CMOS devices.

* * * * *